(12) United States Patent
Wang

(10) Patent No.: US 7,968,268 B2
(45) Date of Patent: *Jun. 28, 2011

(54) COMPOSITIONS AND PROCESSES FOR IMMERSION LITHOGRAPHY

(75) Inventor: Deyan Wang, Hudson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 292 days.

This patent is subject to a terminal disclaimer.

(21) Appl. No.: 11/414,872

(22) Filed: May 1, 2006

(65) Prior Publication Data

US 2006/0246373 A1    Nov. 2, 2006

Related U.S. Application Data

(60) Provisional application No. 60/676,762, filed on May 1, 2005.

(51) Int. Cl.
G03C 1/00 (2006.01)
G03F 1/00 (2006.01)

(52) U.S. Cl. .................................. 430/270.1
(58) Field of Classification Search ............ 430/270.1, 430/322
See application file for complete search history.

(56) References Cited

U.S. PATENT DOCUMENTS

| | | | |
|---|---|---|---|
| 6,479,211 B1 | 11/2002 | Sato et al. | |
| 6,787,286 B2 | 9/2004 | Szmanda et al. | |
| 6,806,022 B1 | 10/2004 | Kawabe et al. | |
| 6,809,794 B1 | 10/2004 | Sewell | |
| 6,852,467 B2 | 2/2005 | Aoai et al. | |
| 7,264,918 B2 | 9/2007 | Endo et al. | |
| 2002/0051928 A1* | 5/2002 | Zampini | 430/138 |
| 2003/0198824 A1 | 10/2003 | Fong et al. | |
| 2004/0009429 A1* | 1/2004 | Sato | 430/287.1 |
| 2004/0068023 A1 | 4/2004 | Leatherdale et al. | |
| 2004/0248032 A1* | 12/2004 | Zampini et al. | 430/270.1 |
| 2004/0259040 A1 | 12/2004 | Endo | |
| 2005/0084794 A1 | 4/2005 | Meagley et al. | |
| 2005/0106494 A1* | 5/2005 | Huang et al. | 430/270.1 |
| 2005/0208419 A1 | 9/2005 | Inabe et al. | |
| 2005/0238993 A1* | 10/2005 | Watanabe et al. | 430/270.1 |
| 2006/0008736 A1 | 1/2006 | Kanda et al. | |
| 2006/0051702 A1 | 3/2006 | Endo et al. | |
| 2006/0078823 A1 | 4/2006 | Kanda et al. | |
| 2006/0166130 A1 | 7/2006 | Ogata et al. | |
| 2006/0199100 A1 | 9/2006 | Kanda | |
| 2006/0222866 A1 | 10/2006 | Nakamura et al. | |
| 2006/0228648 A1 | 10/2006 | Ohsawa et al. | |

FOREIGN PATENT DOCUMENTS

| | | |
|---|---|---|
| EP | 0393673 | 10/1990 |
| EP | 0938026 | 8/1999 |
| EP | 1505439 A2 | 2/2005 |
| EP | 1 580 598 | 9/2005 |
| EP | 1 621 927 | 2/2006 |
| EP | 1 645 908 A1 | 4/2006 |
| JP | 11218927 | 8/1999 |
| JP | 2000010287 | 1/2000 |
| JP | 2000338676 | 12/2000 |
| JP | 2002333715 | 11/2002 |
| JP | 2004354953 | 12/2004 |
| JP | 2005099646 | 4/2005 |
| JP | 2005128146 | 5/2005 |
| JP | 2005234119 | 9/2005 |
| JP | 2006023692 | 1/2006 |
| JP | 2006-079048 | 3/2006 |
| JP | 2006071889 A | 3/2006 |
| JP | 2006276444 A | 10/2006 |
| JP | 2006276851 A | 10/2006 |
| JP | 2007145797 A | 6/2007 |
| JP | 2006048029 | 2/2008 |
| WO | 2004/076535 A1 | 9/2004 |

OTHER PUBLICATIONS

The Notice of Third Party Submission received from Japanese Associate's prosecuting the corresponding Japanese application dated Sep. 29, 2008.
Notice of Improper Request of the United States Patent and Trademark Office dated Sep. 3, 2008.
Technical Data Sheets relating to the products "Megaface R-08" available from DIC Corporation.
Web-site—cf.http://www.dic.co.jp/en/products/fluoro/additive/all. html, "PolyFox Grade Slate: PF-6520" available from Omnova Solutions Inc.
PF-6320 (x=20) available from Kitamura Chemicals.
English summary of Japanese Office Action for corresponding Japanese Application No. 2006-124957, issued Sep. 30, 2010.
European Examination Report for corresponding European Application No. 06 252 260.2, issued Jan. 27, 2011.
English summary of Chinese Office Action for corresponding Chinese Application No. 2006100798125.
English summary of Korean Office Action for corresponding Korean Application No. 10-2006-0039337.
English Summary of Taiwanese Examination Report dated Jan. 13, 2011 for corresponding Taiwanese Patent Application No. 095115195.

* cited by examiner

Primary Examiner — Cynthia H Kelly
Assistant Examiner — Connie P Johnson
(74) Attorney, Agent, or Firm — Peter F. Corless; Jonathan D. Baskin; Edwards Angell Palmer & Dodge LLP

(57) ABSTRACT

New photoresist compositions are provided that are useful for immersion lithography. Preferred photoresist compositions of the invention comprise one or more materials that can be substantially non-mixable with a resin component of the resist. Further preferred photoresist compositions of the invention comprise 1) Si substitution, 2) fluorine substitution; 3) hyperbranched polymers; and/or 4) polymeric particles. Particularly preferred photoresists of the invention can exhibit reduced leaching of resist materials into an immersion fluid contacting the resist layer during immersion lithography processing.

17 Claims, No Drawings

COMPOSITIONS AND PROCESSES FOR IMMERSION LITHOGRAPHY

The present application claims the benefit of U.S. provisional application No. 60/676,762 filed May 1, 2005.

The present invention relates to new photoresist compositions that are particularly useful in immersion lithography processes. Preferred photoresist compositions of the invention comprises one or more materials that can be substantially non-mixable with a resin component of the resist. Particularly preferred photoresists of the invention can exhibit reduced leaching of resist materials into an immersion fluid contacting the resist layer during immersion lithography processing.

Photoresists are photosensitive films used for transfer of an image to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

The growth of the semiconductor industry is driven by Moore's law which states that the complexity of an IC device doubles on average every two years. This necessitates the need to lithographically transfer patterns and structures with ever decreasing feature size.

One approach to achieving smaller feature sizes is to use shorter wavelengths of light, however, the difficulty in finding materials that are transparent below 193 nm has led to the option of using immersion lithography to increase the numerical aperture of the lens by simply using a liquid to focus more light into the film. Immersion lithography employs a relatively high refractive index fluid between the last surface of an imaging device (e.g., KrF or ArF stepper) and the first surface on a wafer or other substrate.

Extensive and proven immersion lithography systems do not yet generally exist. Certain efforts have been made to address problems associated with immersion lithography. See U.S. Patent Application Publication 2005/0084794. Reliable and convenient photoresist and imaging processes for immersion lithography are clearly needed.

It would be desirable to new materials and processes for immersion photolithograpy.

We now provide new compositions and processes for immersion photolithography.

In one aspect, preferred photoresists of the invention may comprise:

(i) one or more resins, (ii) a photoactive component which may suitably comprise one or more photoacid generator compounds, and (iii) one or more materials that are substantially non-mixable with the one or more resins. Preferably, the components (i), (ii) and (iii) are distinct materials, e.g. not covalently linked. Preferably the photoresist is a chemically-amplified positive resist, e.g. at least one resin of the one or more resins of component (i) comprises photoacid-labile groups, such as photoacid-labile ester and/or acetal groups.

In another aspect, preferred photoresists of the invention may comprise:

(i) one or more resins, (ii) a photoactive component which may suitably comprise one or more photoacid generator compounds, and (iii) one or more materials that comprise 1) Si substitution, 2) fluorine substitution; 3) hyperbranched polymers; and/or 4) polymeric particles are substantially non-mixable with the one or more resins. Preferably, the components (i), (ii) and (iii) are distinct materials, e.g. not covalently linked. Preferably the photoresist is a chemically-amplified positive resist, e.g. at least one resin of the one or more resins of component (i) comprises photoacid-labile groups, such as photoacid-labile ester and/or acetal groups.

Particularly preferred photoresists of the invention can exhibit reduced migration (leaching) of photoresist components into the immersion fluid during contact of the immersion fluid during an exposure step. Significantly, such reduced migration of photoresist materials into immersion fluid can be achieved without applying any type of cover or barrier layer over the photoresist and interposed between the resist layer and immersion fluid.

We have found that undesired migration of acid and/or other resist materials from a photoresist layer into the immersion fluid layer can be particularly problematic. Among other things, the acid or other photoresist materials that migrate into the immersion fluid can damage the exposure tool as well as reduce resolution of an image patterned into a photoresist layer. Accordingly, the photoresists of the invention constitute a significant advance.

Without being bound by any theory, it is believed the one or more materials that are substantially non-mixable with the one or more resist resins can migrate toward upper regions of an applied photoresist coating layer and thereby inhibit migration of photoresist materials out of a resist layer into immersion fluid that contacts the resist layer during an immersion exposure step.

As referred to herein, one or more materials that are substantially non-mixable with the one or more photoresist resins can be any material added to a photoresist that results in reduced migration or leaching of photoresist materials into immersion fluid. Such substantially non-mixable materials can be readily identified empirically by testing relative to a control resist that has the same components as the tested photoresist, but not the candidate substantially non-mixable material(s).

Suitable substantially non-mixable materials for use in photoresists of the invention include compositions that comprise silicon and/or fluorine substitution.

Preferred substantially non-mixable materials for use in photoresists of the invention may be in the form of particles. Such particles may include polymers that are polymerized in the form discrete particles, i.e. as separate and distinct polymer particles. Such polymer particles typically have one or more different characteristics from linear or ladder polymers such as linear or ladder silicon polymers. For example, such polymer particles may have a defined size and a low molecular weight distribution. More particularly, in a preferred aspect, a plurality of the polymer particles maybe employed in a photoresist of the invention with a mean particle size (dimension) of from about 5 to 3000 angstroms, more preferably from about 5 to 2000 angstroms, still more preferably from about 5 to about 1000 angstroms, yet more preferably from about 10 to about 500 angstroms, even more preferably from 10 to 50 or 200 angstroms. For many applications, particularly preferred particles have a mean particle size of less than about 200 or 100 angstroms.

Additional preferred substantially non-mixable materials for use in photoresists of the invention may have Si content, including silsesquioxane materials, materials with $SiO_2$ groups, and the like. Preferred silicon-containing substantially non-mixable materials also include polyhedral oligomeric silsesquioxanxes.

Also preferred are those substantially non-mixable materials that contain photoacid-labile groups, such as photoacid-labile ester or acetal groups, including such groups as described herein employed in a resin component of a chemically amplified photoresist.

Preferred substantially non-mixable materials for use in photoresists of the invention also will be soluble in the same organic solvent(s) used to formulate the photoresist composition.

Particularly preferred substantially non-mixable materials for use in photoresists of the invention also will have lower surface energy and/or smaller hydrodynamic volume than the one or more resins of the photoresist's resin component. The lower surface energy can facilitate segregation or migration of the substantially non-mixable materials to top or upper portions of an applied photoresist coating layer. Additionally, relative smaller higher hydrodynamic volume also can be preferred because it can facilitate efficient migration (higher diffusion coefficient) of the one or more substantially non-mixable materials to upper regions of the applied photoresist coating layer.

Preferred substantially non-mixable materials for use in photoresists of the invention also will be soluble or become soluble upon post exposure bake (PEB, e.g. 120° C. for 60 seconds) in photoresist developer compositions (e.g. 0.26N aqueous alkaline solution). Thus, in addition to photoacid-labile groups as discussed above, other aqueous base-solubilizing groups may be included in the substantially non-mixable materials such as hydroxyl, fluoroalcohol, carboxy and the like.

Preferred non-mixable materials include polymeric materials including hyperbranched polymers. As referred to herein, "hyperbranched polymers" include those materials known as "hyperbranched polymers" under the IUPAC nomenclature. See IUPAC. Compendium of Macromolecular Nomenclature (The Purple Book); Metanomski, W. V., Ed.; Blackwell Scientific Publications, Oxford, UK, 1991. Thus, by this nomenclature, a hyperbranched polymer has structural repeating units (or constitutional repeating unit as referred to by IUPAC) where such structural repeating units each has a covalent connectivity of more than two. Particularly preferred hyperbranched polymers may have minimal (e.g. less than 5, 4, 3, 2 or 1 weight percent) aromatic content, or be completely free of any aromatic content.

Hyperbranched polymers that have one or more acrylate repeat units may be particularly suitably for many applications.

Also preferred are polymer additives that are formed from multi-functional acrylate monomers, e.g. acrylate monomers that have multiple vinyl groups such as trimethypropane triacrylate (sometimes referred to herein "TMPTA").

In a further aspect, the invention provides methods for lithographic processing in an immersion exposure protocol. Preferred methods of the invention may include the following steps:

1) apply (e.g. by spin coating) a photoresist composition of the invention to a substrate such as a semiconductor wafer. The photoresist may be suitably applied on the wafer surface or a material previously applied over the wafer such as an organic or inorganic antireflective composition, or a planarizing layer, and the like. The applied photoresist may be thermally treated to remove solvent carrier, e.g. at about 120° C. or less for about 30 to 60 seconds;

3) optionally, above the photoresist composition, apply an organic barrier composition, e.g. by spin coating;

4) exposing the overcoated photoresist layer to patterned activating radiation with a fluid (e.g. a fluid comprising water) interposed between the exposure tool and the coated substrate, i.e. immersion exposing the photoresist layer by a fluid layer interposed between the exposure tool and the photoresist composition layer. The interposed fluid will directly contact the photoresist layer in the absence of any barrier composition.

Preferred imaging wavelengths of lithographic systems of the invention include sub-400 nm such as I-line (365 nm), sub-300 nm wavelengths e.g. 248 nm, and sub-200 nm wavelengths e.g. 193 nm. In addition to one or more substantially non-mixable materials, particularly preferred photoresists of the invention may contain a photoactive component (e.g. one or more photoacid generator compounds) and one or more resins that are chosen from among:

1) a phenolic resin that contains acid-labile groups that can provide a chemically amplified positive resist particularly suitable for imaging at 248 nm.

Particularly preferred resins of this class include: i) polymers that contain polymerized units of a vinyl phenol and an alkyl acrylate, where the polymerized alkyl acrylate units can undergo a deblocking reaction in the presence of photoacid. Exemplary alkyl acrylates that can undergo a photoacid-induced deblocking reaction include e.g. t-butyl acrylate, t-butyl methacrylate, methyladamantyl acrylate, methyl adamantyl methacrylate, and other non-cyclic alkyl and alicyclic acrylates that can undergo a photoacid-induced reaction, such as polymers in U.S. Pat. Nos. 6,042,997 and 5,492,793, incorporated herein by reference; ii) polymers that contain polymerized units of a vinyl phenol, an optionally substituted vinyl phenyl (e.g. styrene) that does not contain a hydroxy or carboxy ring substituent, and an alkyl acrylate such as those deblocking groups described with polymers i) above, such as polymers described in U.S. Pat. No. 6,042,997, incorporated herein by reference; and iii) polymers that contain repeat units that comprise an acetal or ketal moiety that will react with photoacid, and optionally aromatic repeat units such as phenyl or phenolic groups; such polymers have been described in U.S. Pat. Nos. 5,929,176 and 6,090,526, as well as blends of i) and/or ii) and/or iii);

2) phenolic resins that do not contain acid-labile groups such as poly(vinylphenol) and novolak resins that may be employed in I-line and G-line photoresists together with a diazonaphthoquinone photoactive compound and have been described e.g. in U.S. Pat. Nos. 4,983,492; 5,130,410; 5,216,111; and 5,529,880;

3) a resin that is substantially or completely free of phenyl or other aromatic groups that can provide a chemically amplified positive resist particularly suitable for imaging at sub-200 nm wavelengths such as 193 nm. Particularly preferred resins of this class include: i) polymers that contain polymerized units of a non-aromatic cyclic olefin (endocyclic double bond) such as an optionally substituted norbornene, such as polymers described in U.S. Pat. Nos. 5,843,624, and 6,048,664; ii) polymers that contain alkyl acrylate units such as e.g. t-butyl acrylate, t-butyl methacrylate, methyladamantyl acrylate, methyl adamantyl methacrylate, and other non-cyclic alkyl and alicyclic acrylates; such polymers have been described in U.S. Pat. No. 6,057,083; European Published Applications EP01008913A1 and EP00930542A1; and U.S. Pat. No. 6,136,501, and iii) polymers that contain polymerized anhydride units, particularly polymerized maleic anhydride and/or itaconic anhydride units, such as disclosed in European Published Application EP01008913A1 and U.S. Pat. No. 6,048,662, as well as blends of i) and/or ii) and/or iii);

4) a resin that contains repeat units that contain a hetero atom, particularly oxygen and/or sulfur (but other than an anhydride, i.e. the unit does not contain a keto ring atom), and preferable are substantially or completely free of any aromatic units. Preferably, the heteroalicyclic unit is fused to the resin backbone, and further preferred is where the resin comprises a fused carbon alicyclic unit such as provided by polymerization of a norborene group and/or an anhydride unit such as provided by polymerization of a maleic anhydride or itaconic anhydride. Such resins are disclosed in PCT/US01/14914 and U.S. Pat. No. 6,306,554;

5) resins that contain Si-substitution including poly(silsequioxanes) and the like and may be used with an undercoated layer. Such resins are disclosed e.g. in U.S. Pat. No. 6,803,171.

6) a resin that contains fluorine substitution (fluoropolymer), e.g. as may be 5 provided by polymerization of tetrafluoroethylene, a fluorinated aromatic group such as fluorostyrene compound, compounds that comprise a hexafluoroalcohol moiety, and the like. Examples of such resins are disclosed e.g. in PCT/US99/21912.

Preferred photoresists of the invention include both chemically-amplified positive-acting and negative-acting photoresists. Typically preferred chemically-amplified positive resists include one or more resins that comprise photoacid-labile groups such as photoacid-labile ester or acetal groups.

The invention further provides methods for forming a photoresist relief image and producing an electronic device using photoresists of the invention. The invention also provides novel articles of manufacture comprising substrates coated with a photoresist composition of the invention.

Other aspects of the invention are disclosed infra.

As discussed above, and demonstrated in the examples which follow, particularly preferred photoresists of the invention can exhibit reduced migration (leaching) of photoresist components into the immersion fluid during contact of the immersion fluid during an exposure step. We also have surprisingly found that addition of the one or more substantially non-mixable materials can improve lithographic performance of a photoresist. In particular, addition of one or more substantially non-mixable materials can reduce line edge roughness of a developed resist including in line-space applications.

Addition of one or more substantially non-mixable materials also can make contact holes more circular in contact-hole applications.

As discussed above, suitable materials of photoresists of the invention that are substantially non-mixable with the resist resin component can be readily identified by simple testing. In particular, as referred to herein, preferred substantially non-mixable materials will provide a decreased amount of acid or organic material to be detected in the immersion fluid upon use of the photoresist composition containing the candidate material relative to the same photoresist system that is processed into the same manner, but in the absence of the candidate substantially non-mixable material(s). Detection of photoresist material in the immersion fluid can be conducted as described in Example 2 which follows and includes mass spectroscopy analysis of the immersion fluid before and after exposure to the photoresist. In such analysis, the immersion fluid directly contacts the tested photoresist composition layer for about 60 seconds during exposure. Preferably, addition of one or more substantially non-mixable materials provides at least a 10 percent reduction in photoresist material (again, acid or organics as detected by mass spectroscopy) residing in the immersion fluid relative to the same photoresist that does not employ such substantially non-mixable material(s), more preferably the one or more substantially non-mixable materials provides at least a 20, 50, or 100, 200, 500, or 1000 percent reduction photoresist material (again, acid and/or organics) residing in to the immersion fluid relative to the same photoresist that does not contain the substantially non-mixable material(s).

As discussed above, specifically preferred substantially non-mixable materials include Si-containing materials. Especially preferred substantially non-mixable materials include nanostructured compositions, which are commercially available from groups such as Hybrid Plastics (Fountain Valley, Calif.), Sigma/Aldrich, and others. Such materials may include molecular silicas which have a Si—O core enveloped by organic groups; silanols; and polymers and resins which include silsesquioxane cage-structured compounds and may be silicones, styrenics, acrylics, alicyclics such as norbornenes and others.

Particles (including organic particles) useful as substantially non-mixable materials include Si-containing and fluorinated materials. Such particles are commercially available, or can be readily synthesized, e.g. by reaction of one or more monomers together with a crosslinking agent and an initiator compound if desired. The reacted monomers may have substitution as desired e.g. fluorine, Si groups, photoacid-labile groups such as photoacid-labile esters or acetals, other base-solubilizing groups such as alcohols and the like. See Example 1 which follows for an exemplary synthesis of such particles produced with multiple distinct monomers, where one of the monomers provides a photoacid-labile group to the resulting polymer particle.

The substantially non-mixable material(s) may be present in a photoresist composition in relatively small amounts and still provide effective results. For instance, the one or more substantially non-mixable materials may be suitable present in about 0.1 to 20 weight percent based on total weight of a fluid photoresist composition. Suitable amounts also are provided in the examples which follow.

As discussed above, preferred photoresists for use in accordance with the invention include positive-acting or negative-acting chemically amplified photoresists, i.e. negative-acting resist compositions which undergo a photoacid-promoted crosslinking reaction to render exposed regions of a coating layer of the resist less developer soluble than unexposed regions, and positive-acting resist compositions which undergo a photoacid-promoted deprotection reaction of acid labile groups of one or more composition components to render exposed regions of a coating layer of the resist more soluble in an aqueous developer than unexposed regions. Ester groups that contain a tertiary non-cyclic alkyl carbon (e.g. t-butyl) or a tertiary alicyclic carbon (e.g. methyladamantyl) covalently linked to the carboxyl oxygen of the ester are often preferred photoacid-labile groups of resins employed in photoresists of the invention. Acetal photoacid-labile groups also will be preferred.

Preferred photoresists of the invention typically comprise a resin component and a photoactive component. Preferably the resin has functional groups that impart alkaline aqueous developability to the resist composition. For example, preferred are resin binders that comprise polar functional groups such as hydroxyl or carboxylate. Preferably a resin component is used in a resist composition in an amount sufficient to render the resist developable with an aqueous alkaline solution.

For imaging at wavelengths greater than 200 nm, such as 248 nm, phenolic resins are typically preferred. Preferred phenolic resins are poly (vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Also preferred for imaging at wavelengths greater than 200 nm, such as 248 nm are chemically amplified photoresists that comprise in admixture a photoactive component and a resin component that comprises a copolymer containing both phenolic and non-phenolic units. For example, one preferred group of such copolymers has acid labile groups substantially, essentially or completely only on non-phenolic units of the copolymer, particularly alkylacrylate photoacid-labile groups, i.e. a phenolic-alkyl acrylate copolymer. One especially preferred copolymer binder has repeating units x and y of the following formula:

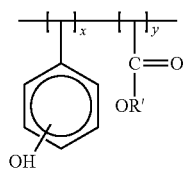

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$alkoxy, $C_{2-8}$alkenyl, etc. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a $M_w$ of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornanyl or vinyl cyclohexanol compound, also may be used as a resin binder in compositions of the invention. Such copolymers also may be prepared by such free radical polymerization or other known procedures and suitably will have a $M_w$ of from about 8,000 to about 50,000, and a molecular weight distribution of about 3 or less.

Other preferred resins that have acid-labile deblocking groups for use in a positive-acting chemically-amplified photoresist of the invention have been disclosed in European Patent Application 0829766A2 of the Shipley Company (resins with acetal and ketal resins) and European Patent Application EP0783136A2 of the Shipley Company (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

As discussed above, for imaging at sub-200 nm wavelengths such as 193 nm, preferably a photoresist is employed that contains one or more polymers that are substantially, essentially or completely free of phenyl or other aromatic groups. For example, for sub-200 nm imaging, preferred photoresist polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

Suitable polymers that are substantially or completely free of aromatic groups and may be formulated with a PAG of the invention to provide a photoresist for sub-200 nm imaging are disclosed in European application EP930542A1 and U.S. Pat. Nos. 6,692,888 and 6,680,159, all of the Shipley Company.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Preferred negative-acting compositions of the invention comprise one or more materials (such as a crosslinker component e.g. an amine-based materials such as a melamine resin) that will cure, crosslink or harden upon exposure to acid, and a photoactive component of the invention. Particularly preferred negative acting compositions comprise a resin binder such as a phenolic resin, a crosslinker component and a photoactive component of the invention. Such compositions and the use thereof has been disclosed in European Patent Applications 0164248 and 0232972 and in U.S. Pat. No. 5,128,232 to Thackeray et al. Preferred phenolic resins for use as the resin binder component include novolaks and poly (vinylphenol)s such as those discussed above.

Preferred crosslinkers include amine-based materials, including melamine, glycolurils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycoluril resins are sold by American Cyanamid under trade names Cymel 1170, 1171, 1172, urea-based resins are sold under the trade names of Beetle 60, 65 and 80, and benzoguanamine resins are sold under the trade names Cymel 1123 and 1125.

For imaging at sub-200 nm wavelengths such as 193 nm, preferred negative-acting photoresists are disclosed in WO 03077029 to the Shipley Company.

Photoresists of the invention also may contain other materials. For example, other optional additives include actinic and contrast dyes, anti-striation agents, plasticizers, speed enhancers, sensitizers (e.g. for use of a PAG of the invention at longer wavelengths such as I-line (i.e. 365 nm) or G-line wavelengths), etc. Such optional additives typically will be present in minor concentration in a photoresist composition except for fillers and dyes which may be present in relatively large concentrations such as, e.g., in amounts of from 5 to 30 percent by weight of the total weight of a resist's dry components.

A preferred optional additive of resists of the invention is an added base, e.g. a caprolactam, which can enhance resolution of a developed resist relief image. The added base is suitably used in relatively small amounts, e.g. about 1 to 10 percent by weight relative to the PAG, more typically 1 to about 5 weight percent. Other suitable basic additives include ammonium sulfonate salts such as piperidinium p-toluenesulfonate and dicyclohexylammonium p-toluenesulfonate; alkyl amines such as tripropylamine and dodecylamine; aryl amines such as diphenylamine, triphenylamine, aminophenol, 2-(4-aminophenyl)-2-(4-hydroxyphenyl)propane, etc.

The resin component of resists of the invention is typically used in an amount sufficient to render an exposed coating layer of the resist developable such as with an aqueous alkaline solution. More particularly, a resin binder will suitably comprise 50 to about 90 weight percent of total solids of the resist. The photoactive component should be present in an amount sufficient to enable generation of a latent image in a coating layer of the resist. More specifically, the photoactive component will suitably be present in an amount of from about 1 to 40 weight percent of total solids of a resist. Typically, lesser amounts of the photoactive component will be suitable for chemically amplified resists.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

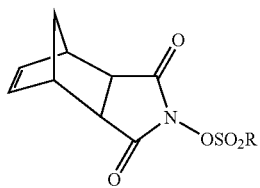

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbomene-2,3-dicarboximide.

Sulfonate compounds are also suitable PAGs, particularly sulfonate salts. Two suitable agents for 193 nm and 248 nm imaging are the following PAGS 1 and 2:

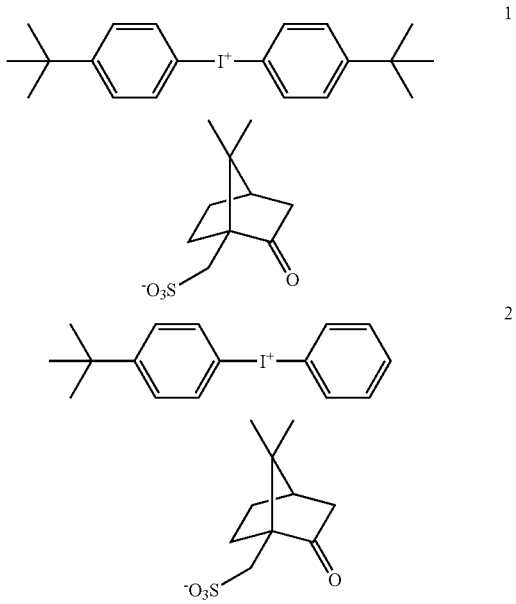

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$—where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in photoresists used in accordance with the invention. Particularly for 193 nm imaging, generally preferred are PAGS that do not contain aromatic groups, such as the above-mentioned imidosulfonates, in order to provide enhanced transparency.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The photoresists used in accordance with the invention are generally prepared following known procedures. For example, a resist of the invention can be prepared as a coating composition by dissolving the components of the photoresist in a suitable solvent such as, e.g., a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 percent by weight of the total weight of the photoresist composition. Blends of such solvents also are suitable.

Liquid photoresist compositions may be applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed. Photoresists also may be suitably applied over an antireflective layer, particularly an organic antireflective layer.

Following coating of the photoresist onto a surface, it may be dried by heating to remove the solvent until preferably the photoresist coating is tack free.

The photoresist layer (with overcoated barrier composition layer, if present) in then exposed in an immersion lithography system, i.e. where the space between the exposure tool (particularly the projection lens) and the photoresist coated substrate is occupied by an immersion fluid, such as water or water mixed with one or more additives such as cesium sulfate which can provide a fluid of enhanced refractive index. Preferably the immersion fluid (e.g., water) has been treated to avoid bubbles, e.g. water can be degassed to avoid nanobubbles.

References herein to "immersion exposing" or other similar term indicates that exposure is conducted with such a fluid layer (e.g. water or water with additives) interposed between an exposure tool and the coated photoresist composition layer.

The photoresist composition layer is then suitably patterned exposed to activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component (e.g. producing photoacid from the photoacid generator compound).

As discussed above, photoresist compositions are preferably photoactivated by a short exposure wavelength, particularly a sub-400 nm, sub-300 and sub-200 nm exposure wavelength, with I-line (365 nm), 248 nm and 193 nm being particularly preferred exposure wavelengths as well as EUV and 157 nm.

Following exposure, the film layer of the composition is preferably baked at temperatures ranging from about 70° C. to about 160° C. Thereafter, the film is developed, preferably by treatment with an aqueous based developer such as quaternary ammonium hydroxide solutions such as a tetra-alkyl ammonium hydroxide solution; various amine solutions preferably a 0.26 N tetramethylanunonium hydroxide, such as ethyl amine, n-propyl amine, diethyl amine, di-n-propyl amine, triethyl amine, or methyldiethyl amine;

alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

The following non-limiting examples are illustrative of the invention.

EXAMPLE 1

Particle Additive Preparation

A preferred fluorinated particle additive is prepared as follows:

A reactor vessel is charged with a desired amount of propylene glycol monomethyl ether acetate (PGMEA) and heated to 80° C. with $N_2$ purge. The following monomers (PFPA, ECPMA, TMPTA), cross-linker and initiator (t-amyl peroxypivalate) are mixed in PGMEA at 80 to 90 weight % fluid composition in an ice bath. The initiator content is 4% relative to the total amount of monomers and cross-liker. The monomers were used in the following weight amounts: 70 weight % pentafluoracrylate (PFPA), 20 weight % ethyl cyclopentyl methacrylate (ECPMA), and 10 weight % (trimethypropane triacrylate (TMPTA):

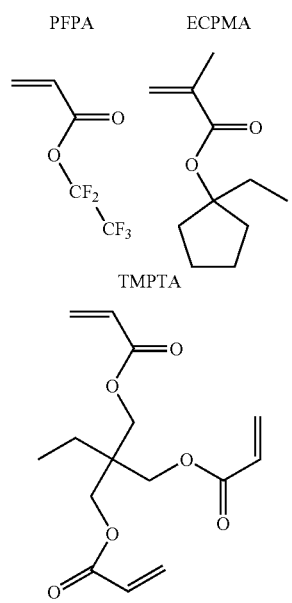

That monomer/crosslinker/initiator/PGMEA mixture is then fed into the reactor vessel in a course of 90 minutes. After the addition to the reactor vessel is complete, the temperature of mixture within the reactor vessel is held at 80° C. for 30 minutes. Then, an additional 2 weight % (relative to the total monomers and cross-linker) of initiator is fed into the reactor. 30 minutes later, another 2 weight % (relative to the total monomers and cross-linker) of initiator is fed into the reactor. After that addition, the temperature of the mixture within the reactor vessel is held at 80° C. for additional 2 hours. Thereafter, the temperature of the reactor vessel is permitted to cool to room temperature.

By that procedure, polymer particles were provided that had a number-average molecular weight (Nm) of 7088 and a weight-average molecular weight (Mw) of 19255.

EXAMPLE 2

Photoresist Preparation and Processing

A photoresist composition is prepared by admixing the following materials in the specified amounts:
1. Resin component: Terpolymer of (2-methyl-2-adamantyl methacrylate/beta-hydroxy-gamma-butyrolactone methacrylate/cyano-norbomyl methacrylate in an amount of 6.79 weight % based on total weight of the photoresist composition;
2. Photoacid generator compound: T-butyl phenyl tetramethylene sulfonium perfluorobutanesulfonate in an amount of 0.284 weight % based on total weight of the photoresist composition;
3. Base additive: N-Alkyl Caprolactam in an amount of 0.017 weight % based on total weight of the photoresist composition;
4. Surfactant: R08 (fluorine-containing surfactant, available from Dainippon Ink & Chemicals, Inc.) in an amount of 0.0071 weight % based on total weight of the photoresist composition
5. Substantially non-mixable additive: fluorinated PFPA/ECPMA/TMPTA terpolymer particle having Nm of 7088 and Mw of 19255 prepared as described in Example 1 above and in an amount of 0.213 weight % based on total weight of the photoresist composition.
6. Solvent component: propylene glycol monomethyl ether acetate to provide about a 90 percent fluid composition.

A control photoresist composition also is prepared that has the same components and amounts thereof as the above photoresist composition, but the control photoresist does not contain a substantially non-mixable additive.

Both the control photoresist composition and above photoresist composition containing were spin-coated onto silicon wafers, dried on vacuum hotplate to remove soft-plate and then exposed in an immersion lithography process with aqueous immersion fluid directly contacting the dried photoresist layers. In that immersion system, the photoresist layers were exposed to patterned 193 nm radiation at a dose of 24.1 mJ/cm² for the control photoresist layers and 23.4 mJ/cm² for the photoresist composition layers that contained the substantially non-mixable additive.

The photoresist layers were then post-exposed baked (such as at about 120° C.) and developed with 0.26N alkaline aqueous developer solution to provide well-resolved 90 nm 1:1 lines and spaces.

To evaluate leaching of resist components, the following protocol was utilized: 1 ml of deionized (DI) water was placed on the resist surface in a confined area (4.2 cm²) for 60 seconds. The DI water was then collected for LC/MS analysis to determine the amount 5 of photoacid generator compound (PAG) leached. The control photoresist resulted in 21 ppb of the photoacid generator compound and degradation products in the immersion fluid. The above photoresist composition that contained a substantially non-mixable additive (i.e. fluorinated PFPA/ECPMA/TNTTA terpolymer particles) had 0.21 ppb of the photoacid generator compound and degradation products in the immersion fluid.

EXAMPLE 3

Photoresist Preparation and Processing

A photoresist composition is prepared by admixing the following materials in the specified amounts:

1. Resin component: Terpolymer of (2-methyl-2-adamantyl methacrylate/beta-hydroxy-gamma-butyrolactone methacrylate/cyano-norbomyl methacrylate in an amount of 6.79 weight % based on total weight of the photoresist composition;
2. Photoacid generator compound: T-butyl phenyl tetramethylene sulfonium perfluorobutanesulfonate in an amount of 0.284 weight % based on total weight of the photoresist composition;
3. Base additive: N-Alkyl Caprolactam in an amount of 0.017 weight % based on total weight of the photoresist composition;
4. Surfactant: R08 (fluorine-containing surfactant, available from Dainippon Ink & Chemicals, Inc.) in an amount of 0.0071 weight % based on total weight of the photoresist composition
5. Substantially non-mixable additive: isooctyl polyhedral silsesquoioxane (IPSS) obtained from Hybrid Plastics in an amount of 0.213 weight % based on total weight of the photoresist composition.
6. Solvent component: propylene glycol monomethyl ether acetate to provide about a 90 percent fluid composition.

A control photoresist composition also is prepared that has the same components and amounts thereof as the above photoresist composition, but the control photoresist does not contain a substantially non-mixable additive.

Both the control photoresist composition and above photoresist composition containing were spin-coated onto silicon wafers, dried on vacuum hotplate to remove soft-plate and then exposed in an immersion lithography process with aqueous immersion fluid directly contacting the dried photoresist layers. In that immersion system, both the control photoresist layers and the photoresist composition layers that contained the substantially non-mixable additive were exposed to patterned 193 nm radiation at a dose of 26.5 mJ/cm².

The photoresist layers were then post-exposed baked (such as at about 120° C.) and developed with 0.26N alkaline aqueous developer solution to provide well-resolved 90 nm 1:1 lines and spaces.

To evaluate leaching of resist components, the following protocol was utilized: 1 ml of DI water was placed on the resist surface in a confined area (4.2 cm²) for 60 seconds. The DI water was then collected for LC/MS analysis for the amount of PAG leached. The control photoresist resulted in 16.4 ppb of the photoacid generator compound and degradation products in the immersion fluid. The above photoresist composition that contained a substantially non-mixable additive (i.e. isooctyl polyhedral silsesquoioxane (IPSS)) had 1.76 ppb of the photoacid generator compound in the immersion fluid.

EXAMPLES 4-6

Additional Photoresist Leaching Testing

Additional photoresists were prepared corresponding with to the photoresists of Example 1 above, but with differing amounts of the substantially non-mixable additive of isooctyl polyhedral silsesquoioxane (IPSS, obtained from Hybrid Plastics) as a percentage of total solids. These photoresists were lithographically processed and immersion exposed at 193 nm as described in Example 3 above and evaluated for leaching of photoacid generator compound and degradation products thereof (in parts per billion or ppb) as described in Example 3. Contact angles of the photoresist layers also were evaluated. Results are set forth in the following Table 1.

TABLE 1

| Example No. | Weight Percent IPSS in photoresists to total solids | Amount of photoacid generator leached into immersion fluid | Contact Angle of deionized water |
|---|---|---|---|
| 4 | 1 percent | 2.52 ppb | 104.1° |
| 5 | 2 percent | 2.21 ppb | 106.4° |
| 6 | 3 percent | 1.76 ppb | 105.4° |
| Comparative | 0 percent | 17.0 ppb | 72.2° |

The photoresists of Examples 4-6 also provided well-resolved lines/spaces.

EXAMPLES 7-19

Additional Polymer Additives for Photoresists in Accordance with the Invention

In the following Examples 7-19, the polymers were synthesized by the general procedures of Example 1 above, using the corresponding monomers in the amounts in the below Examples to produce the formed polymers.

EXAMPLE 7

A branched tetrapolymer was prepared having the following repeat units in the respective molar amounts: x/y/z/TMPTA=70/15/5/10, wherein as shown in the immediately below structure the monomer providing polymerized x-units is PFPA (pentafluoropropyl ecrylate), the monomer providing polymerized y-units is ECPMA (ethylcyclopentyl methacrylate), and the monomer providing polymerized z-units is acrylic acid.

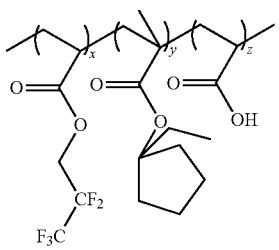

EXAMPLE 8

A hyperbranched tetrapolymer was prepared having the following repeat units in the respective molar amounts: with x/y/z/TMPTA=70/15/5/10, wherein repeat units x, y and z are shown in the immediately below structure. As can be seen from that structure, the monomer polymerized to provide z-units is methacrylic acid.

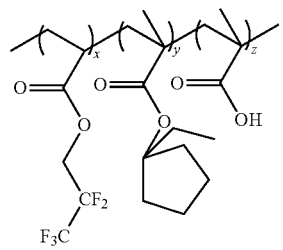

EXAMPLE 9

A hyperbranched terpolymer was prepared having the following repeat units in the respective molar amounts: x/y/TMPTA=70/20/10, wherein repeat units x and y are shown in the immediately below structure.

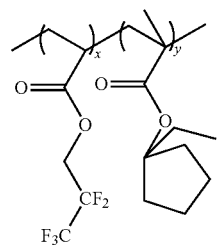

EXAMPLE 10

A hyperbranched terpolymer was prepared having the following repeat units in the respective molar amounts: with x/y/TMPTA=80/10/10, wherein repeat units x and y are shown in the immediately below structure.

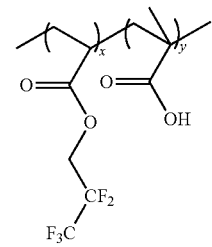

EXAMPLE 11

A linear copolymer was prepared having the following repeat units in the respective molar amounts: y/z=94/6, wherein repeat units y and z are shown in the immediately below structure. As can be seen from that structure, the monomer polymerized to provide y-units is tert-butyl methacrylate.

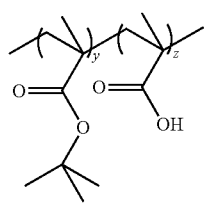

EXAMPLE 12

A linear copolymer was prepared having the following repeat units in the respective molar amounts: y/z=94/6, wherein repeat units y and z are shown in the immediately below structure. As can be seen from that structure, the monomer polymerized to provide z-units is carboxyethyl acrylate.

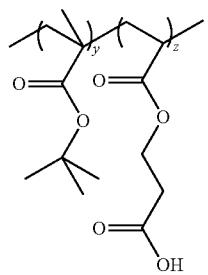

EXAMPLE 13

A linear homopolymer was prepared consisting of polymerized tert-butyl methacrylate groups.

EXAMPLE 14

A linear copolymer was prepared having the following repeat units in the respective molar amounts: y/z=50/50, wherein repeat units y and z are shown in the immediately below structure. As can be seen from that structure, the monomer polymerized to provide z-units is 1-cyclohexyl-3-hydroxy-4, 4, 4-trifluoro-3-(trifluoromethyl)butyl 2-methacrylate.

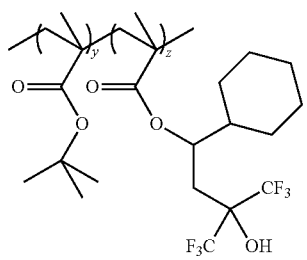

EXAMPLE 15

A linear copolymer was prepared having the following repeat units in the respective molar amounts: y/z=50/50, wherein repeat units y and z are shown in the immediately below structure. As can be seen from that structure, the monomer polymerized to provide z-units is 2-methacrylic acid 4, 4, 4-trifluoro-3-hydroxy-1-methyl-3-trifluromethyl-butyl ester.

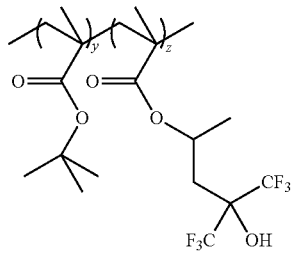

EXAMPLE 16

A linear copolymer was prepared having the following repeat units in the respective molar amounts: y/z=70/30, wherein repeat units y and z are shown in the immediately below structure. As can be seen from that structure, the monomer polymerized to provide z-units is 2-methacrylic acid 4, 4, 4-trifluoro-3-hydroxy-1-methyl-3-trifluromethyl-butyl ester.

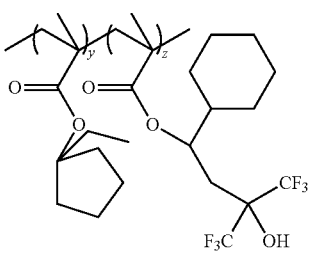

EXAMPLE 17

A hyperbranched terpolymer was prepared having the following repeat units in the respective molar amounts: with y/z/TMPTA=70/30/10, wherein repeat units x and y are shown in the immediately below structure.

EXAMPLE 18

A linear copolymer was prepared having the following repeat units in the respective molar amounts: y/z=50/50, wherein repeat units y and z are shown in the immediately below structure. As can be seen from that structure, the monomers polymerized to provide z-units are 5 and 6-[3,3,3-trifluoro-2-hydroxy-2-(trifluoromethyl)propyl]bicycle[2,2,1]hept-2-yl acrylate.

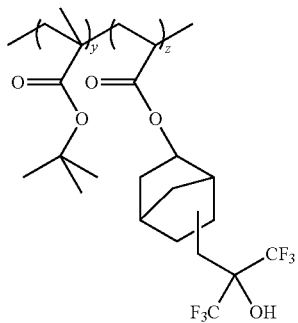

EXAMPLE 19

A linear terpolymer was prepared having the following repeat units in the respective molar amounts: with y/z1/z2=74/20/6=50/50, wherein repeat units y, z1 and z2 are shown in the immediately below structure.

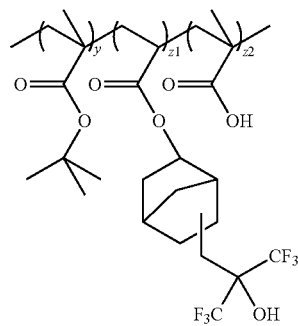

EXAMPLES 20-33

Immersion Leaching Analysis

In the following Examples 20-31, in three different 193 nm photoresists (referred to as first-type, second-type, third-type) polymers of the above Examples 7-18 were added in amounts specified in the below Table 2. The three photoresist compositions (i.e. first-type, second-type, third-type) were each positive chemically-amplified resists that contained non-aromatic resin with photoacid-labile ester groups and separate photoacid generator compounds. In comparative Examples 32 and 33, a further additive (such as polymer) was not added to the first-type and second-type resists. In Table 2 below, references to wt. % relative to total solid means all composition components except solvent carrier.

Leaching analysis was conducted as follows described in Example 3 above and the below Table 2. Results are set forth in Table below.

TABLE 2

| | Barrier layer results (leaching analysis) | | |
|---|---|---|---|
| Example No. | Polymer of Example No. | Polymer admixed in amount and used in specified photoresist | PAG Leaching, mole/cm$^2$, 60 seconds Leaching |
| 20 | 7 | 3 wt. % (relative to total solid) in first-type 193 nm photoresist | $9.67^{-13}$ |
| 21 | 8 | 3 wt. % (relative to total solid) in first-type 193 nm photoresist | $5.08^{-13}$ |
| 22 | 9 | 2 wt. % (relative to total solid) in second-type 193 nm photoresist | $1.05^{-12}$ |
| 23 | 10 | 3 wt. % (relative to total solid) in first-type 193 nm photoresist | $1.19^{-12}$ |
| 24 | 11 | 3 wt. % (relative to total solid) in third-type 193 nm photoresist | $2.42^{-12}$ |
| 25 | 12 | 3 wt. % (relative to total solid) in third-type 193 nm photoresist | $1.84^{-12}$ |
| 26 | 13 | 3 wt. % (relative to total solid) in third-type 193 nm photoresist | $<8.06^{-14}$ |
| 27 | 14 | 3 wt. % (relative to total solid) in third-type 193 nm photoresist | $3.87^{-13}$ |
| 28 | 15 | 3 wt. % (relative to total solid) in third-type 193 nm photoresist | $1.85^{-13}$ |
| 29 | 16 | 2 wt. % (relative to total solid) in second-type 193 nm photoresist | $7.66^{-13}$ |
| 30 | 17 | 3 wt. % (relative to total solid) in third-type 193 nm photoresist | $9.67^{-13}$ |
| 31 | 18 | 3 wt. % (relative to total solid) in third-type 193 nm photoresist | $1.95^{-12}$ |
| 32 (comparative) | No additional polymer | First-type 193 nm photoresist without additional polymer added | $1.21^{-11}$ |
| 33 (comparative) | No additional polymer | Second-type 193 nm photoresist without additional polymer added | $3.06^{-11}$ |

EXAMPLES 34-45

Water Contact Angle Analysis

Water contact angles were evaluated for the spin-coated layers of the polymers as specified in Table 3 below. Several water contact angles were evaluated: static, receding, advancing, sliding, developer static in general accordance with the procedures disclosed in Burnett et al., *J. Vac. Sci. Techn. B*, 23(6), pages 2721-2727 (November/December 2005). Results are set forth in Table 3 below.

The results of these Examples 34-45 also show that photoresist compositions of the invention can be prepared to achieve desired water angles, as may be desired by device manufacturers, such as a receding water contact angle of in excess of 70 and/or a sliding water contact angle of less than 20.

TABLE 3

| Example No. | Polymer of Example No. | DI water contact angles | | | | developer θ static |
|---|---|---|---|---|---|---|
| | | θ static | θ receding | θ advancing | θ sliding | |
| 34 | 7 | 87 | 61 | 98 | 40 | |
| 35 | 8 | 84 | 25 | 148 | 50 | |
| 36 | 9 | 94 | 75 | 100 | 28 | |
| 37 | 10 | 85 | 54 | 97 | 50 | |
| 38 | 11 | 84 | 73 | 88 | 16 | 78 |
| 39 | 12 | 85 | 75 | 89 | 15 | 79 |
| 40 | 13 | 86 | 80 | 90 | 11 | 87 |
| 41 | 14 | 91 | 78 | 93 | 17 | 81 |
| 42 | 15 | 89 | 78 | 92 | 16 | 84 |
| 43 | 16 | 88 | 81 | 92 | 17 | 83 |
| 44 | 17 | 85 | 78 | 90 | 13 | 79 |
| 45 | 18 | 85 | 74 | 89 | 17 | 79 |

What is claimed is:

1. A method for processing a photoresist composition, comprising:
    (a) applying on a substrate a photoresist composition layer comprising:
        (i) one or more resins which comprise one or more photoacid-labile groups,
        (ii) a photoactive component, and
        (iii) one or more fluorinated resins that (a) comprise one or more photoacid-labile groups and (b) are substantially non-mixable with the (i) one or more resins, whereby the (iii) one or more fluorinated resins migrate toward upper portions of the photoresist composition layer during the step of applying, and the (iii) one or more fluorinated resins are distinct from the (i) one or more resins; and
    (b) immersion exposing the applied photoresist layer to radiation activating for the photoresist composition, and the photoresist composition provides a decreased amount of acid or organic material detected in immersion fluid associated with the immersion exposure relative to the same photoresist composition that does not comprise the (iii) one or more fluorinated resins.

2. The method of claim 1 wherein the (iii) one or more fluorinated resins are particles.

3. The method of claim 1 wherein the (iii) one or more fluorinated resins comprise aqueous base-solubilizing groups.

4. The method of claim 1 wherein the (iii) one or more fluorinated resins comprise Si substitution.

5. The method of claim 1 wherein the (iii) one or more fluorinated resins comprise photoacid-labile acetal groups.

6. The method of claim 1 wherein the (iii) one or more fluorinated resins comprise photoacid-labile ester groups.

7. The method of claim 1 wherein the photoresist composition comprises a resin that comprises fluoroalcohol groups.

8. The method of claim 1 wherein the photoresist composition comprises a resin that comprises a hexafluoroalcohol moiety.

9. The method of claim 1 wherein the photoresist layer is exposed to radiation having a wavelength of 193 nm activating for the photoresist composition.

10. The method of claim 1 wherein the (iii) one or more fluorinated resins have a lower surface energy and/or small hydrodynamic volume than the (i) one or more resins.

11. The method of claim 1 wherein the photoresist composition as applied as a spin-coated layer provides a receding water contact angle of in excess of 70 degrees.

12. The method of claim 1 wherein the (iii) one or more fluorinated resins have a smaller hydrodynamic volume than the (i) one or more resins.

13. The method of claim 1 wherein the (iii) one or more fluorinated resins comprise fluoroalcohol groups.

14. The method of claim 1 wherein the (iii) one or more fluorinated resins are present in the photoresist composition in an amount of 0.1 to 20 weight percent based on total weight of the fluid photoresist composition.

15. The method of claim 1 wherein the (iii) one or more fluorinated resins are present in the photoresist composition in an amount of up to 1 weight percent based on total solids of the photoresist composition.

16. The method of claim 1 wherein the (iii) one or more fluorinated resins are present in the photoresist composition in an amount of up to 2 weight percent based on total solids of the photoresist composition.

17. The method of claim 1 wherein the (iii) one or more fluorinated resins are present in the photoresist composition in an amount of up to 3 weight percent based on total solids of the photoresist composition.

* * * * *